(12) United States Patent
Kim et al.

(10) Patent No.: US 7,136,218 B2
(45) Date of Patent: Nov. 14, 2006

(54) RAMAN OPTICAL AMPLIFIER

(75) Inventors: Seung-Woo Kim, Seoul (KR); Seong-Taek Hwang, Pyeongtaek-shi (KR); Jeong-Seok Lee, Anyang-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 220 days.

(21) Appl. No.: 10/701,642

(22) Filed: Nov. 5, 2003

(65) Prior Publication Data
US 2004/0212874 A1    Oct. 28, 2004

(30) Foreign Application Priority Data
Apr. 22, 2003    (KR) ................. 10-2003-0025382

(51) Int. Cl.
*H04B 10/17*    (2006.01)
(52) U.S. Cl. ..................................... 359/334
(58) Field of Classification Search ............ 359/341.32
See application file for complete search history.

(56) References Cited

U.S. PATENT DOCUMENTS

| | | | |
|---|---|---|---|
| 5,861,980 A * | 1/1999 | Ono ..................... | 359/337.12 |
| 6,067,149 A * | 5/2000 | Gripp et al. ............. | 356/73.1 |
| 6,222,962 B1 * | 4/2001 | Nilsson et al. ............ | 385/37 |
| 6,862,132 B1 * | 3/2005 | Casaccia et al. .......... | 359/334 |
| 2001/0024458 A1 * | 9/2001 | Fermann ................. | 372/6 |
| 2002/0024721 A1 * | 2/2002 | Tsuzaki et al. ........... | 359/334 |
| 2002/0054427 A1 * | 5/2002 | Islam .................... | 359/349 |
| 2002/0085267 A1 * | 7/2002 | Akasaka et al. ........... | 359/334 |
| 2002/0101649 A1 * | 8/2002 | Islam .................... | 359/334 |
| 2002/0154383 A1 * | 10/2002 | Oron et al. .............. | 359/326 |
| 2003/0117692 A1 * | 6/2003 | Tanaka et al. ............ | 359/334 |
| 2003/0137720 A1 * | 7/2003 | Onaka et al. ............. | 359/334 |
| 2003/0169490 A1 * | 9/2003 | Hwang et al. ............ | 359/341.41 |
| 2003/0179442 A1 * | 9/2003 | Hwang .................. | 359/341.41 |

FOREIGN PATENT DOCUMENTS

| | | |
|---|---|---|
| JP | 08-330650 | 12/1996 |
| JP | 2001-028569 | 1/2001 |
| JP | 2001-209082 | 8/2001 |
| JP | 2001-284726 | 10/2001 |
| JP | 2002-244169 | 8/2002 |

\* cited by examiner

*Primary Examiner*—Jack Keith
*Assistant Examiner*—Ari M. Diacou
(74) *Attorney, Agent, or Firm*—Cha & Reiter, L.L.C.

(57) ABSTRACT

A Raman optical amplifier includes a fiber amplifier for Raman-amplifying an input optical signal to form a primarily-amplified optical signal, and a semiconductor optical amplifier for outputting a Raman pumping light of a predetermined wavelength adapted to Raman-pump the fiber amplifier, while amplifying the primarily-amplified optical signal to form a secondarily-amplified optical signal. A circulator allows the fiber and semiconductor amplifiers to communicate the lights and signals and operates with fiber grating, which acts as a filter, to output the secondarily-amplified optical signal

8 Claims, 3 Drawing Sheets

RAMAN OPTICAL AMPLIFIER

CLAIM OF PRIORITY

This application claims priority to an application entitled "RAMAN OPTICAL AMPLIFIER," filed in the Korean Intellectual Property Office on Apr. 22, 2003 and assigned Ser. No. 2003-25382, the contents of which are hereby incorporated by reference.

BACKGROUND OF THE INVENTION

1. Field of the Invention

The present invention relates to an optical amplifier for optical communication, and more particularly to a Raman optical amplifier that includes a Raman pumping light source and a fiber amplifier in order to Raman-amplify an optical signal.

2. Description of the Related Art

For long-distance transmission of optical signals, optical communication networks use various optical amplifiers adapted to amplify the intensity of an optical signal to be transmitted. However, such optical amplifiers not only amplify the intensity of an optical signal to be transmitted, but also amplify noise contained in the optical signal.

The erbium-doped fiber amplifier is mainly used in backbone networks and metro networks by virtue of its high gain, low noise figure, and high saturated output power. However, it is expensive and relatively large in size, as compared to other optical amplifiers, even though it has many advantages as mentioned above. Semiconductor optical amplifiers feature low cost and relatively wide amplification band. However, they have limited application due to their high noise characteristics. To avoid increasing noise upon amplification without encountering the above problems, a Raman optical amplifier has been proposed which is configured by adding a Raman pumping light source to an optical amplifier having a conventional configuration.

FIG. 1 illustrates a Raman optical amplifier including a conventional fiber amplifier and a Raman pumping light source. The Raman optical amplifier module includes a Raman optical fiber amplifier 110, a Raman pumping light source 130 for Raman pumping the fiber amplifier 110, and a semiconductor optical amplifier (SOA) 140 for secondarily amplifying an optical signal Raman-amplified by the fiber amplifier 110. The Raman optical amplifier module also includes a first isolator 150, a second isolator 160, and a wavelength selective coupler (WSC) 120.

The fiber amplifier 110 is Raman-amplified by a Raman pumping light of a predetermined wavelength, thereby Raman-amplifying an optical signal inputted thereto. For the fiber amplifier 110, a single-mode optical fiber may be used.

The first isolator 150 outputs, to the fiber amplifier 110, an optical signal to be amplified. The first isolator 150 also prevents the optical signal, amplified by the fiber amplifier 110, from flowing back, thereby minimizing loss of the optical signal.

The Raman pumping light source 130 serves to output the Raman pumping light of predetermined wavelength for Raman-pumping the fiber amplifier 110. For the Raman pumping light source 130, a semiconductor laser may be used.

For the wavelength selective coupler 120, an arrayed waveguide grating having a Y-branch structure may be used. The wavelength selective coupler 120 is connected to the Raman pumping light source 130, fiber amplifier 110, and semiconductor optical amplifier 140. Accordingly, the wavelength selective coupler 120 outputs the Raman pumping light emitted from the Raman pumping light source 130, while outputting the Raman-amplified optical signal from the fiber amplifier 110 to the semiconductor optical amplifier 140.

The semiconductor optical amplifier 140 performs a secondary amplification for the Raman-amplified optical signal from the fiber amplifier 110, that is, re-amplifies the Raman-amplified optical signal, and then outputs the resultant optical signal to the second isolator 160. As the optical signal already amplified in the fiber amplifier 110 is re-amplified by the semiconductor optical amplifier 140, an improvement in amplification gain is achieved. Also, since the optical signal is Raman-amplified in the fiber amplifier 110, it is possible to reduce the noise caused by the amplification of the optical signal carried out in the semiconductor optical amplifier 140.

The second isolator 160 externally outputs the optical signal amplified by the semiconductor optical amplifier 140. The second isolator 160 also serves to prevent the optical signal, inputted thereto, from flowing into the semiconductor optical amplifier 140.

In a Raman fiber amplifier having the above mentioned configuration, however, it is necessary to additionally use a separate pumping light source for Raman-amplifying the fiber amplifier, and a semiconductor optical amplifier. Energization of the pumping light source and semiconductor optical amplifier increases power consumption. The addition of the pumping light source and semiconductor optical amplifier also increases manufacturing costs and the volume of the Raman fiber amplifier.

SUMMARY OF THE INVENTION

The present invention has been made in view of the above-mentioned problems involved with the related art, and features a Raman optical amplifier capable of minimizing its size and power consumption while securing an improved amplification efficiency.

In accordance with the present invention, this object is accomplished by providing a Raman optical amplifier comprising: a fiber amplifier for Raman-amplifying an input optical signal advancing therein, thereby outputting a primarily-amplified optical signal; a semiconductor optical amplifier for outputting a Raman pumping light of a predetermined wavelength adapted to Raman-pump the fiber amplifier, while amplifying the primarily-amplified optical signal, thereby outputting a secondarily-amplified optical signal; a circulator having first through third ports, and adapted to receive the primarily-amplified optical signal at the first port, to output the received primarily-amplified optical signal to the second port, to receive the Raman pumping light and the secondarily-amplified optical signal at the second port, to output the received Raman pumping light and secondarily-amplified optical signal to the third port, to re-receive the Raman pumping light at the third port, and to output the re-received Raman pumping light to the first port; and a fiber grating connected to the third port of the circulator, and adapted to reflect the Raman pumping light received from the third port of the circulator while passing the secondarily-amplified optical signal received from the third port of the circulator.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENT

Preferred embodiments of the present invention will be described below in detail with reference to the annexed drawings. In the following description of the present invention, detailed description of known functions and configurations incorporated herein will be omitted for clarity of presentation.

Figure 1:
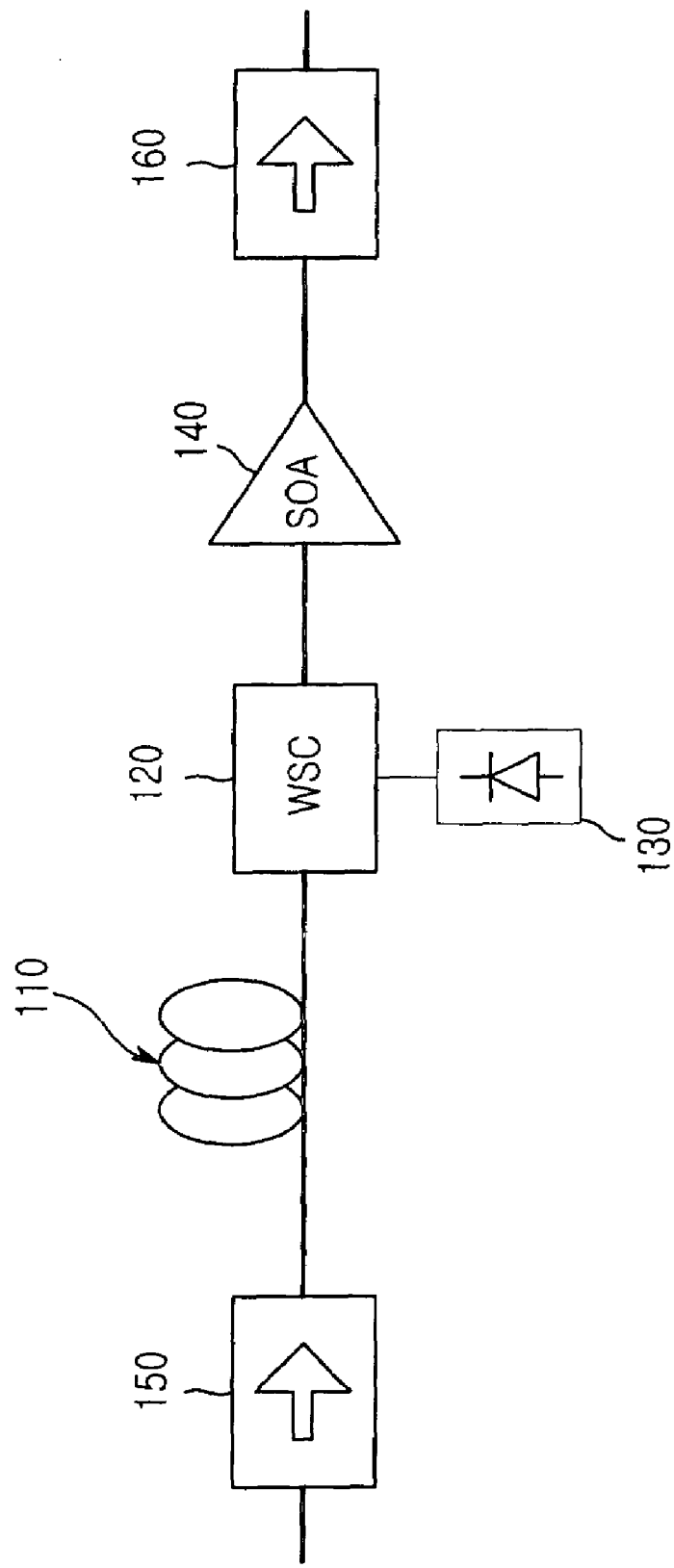
FIG. 1 is a schematic diagram illustrating the configuration of a conventional Raman optical amplifier including a fiber amplifier and a Raman pumping light source.
Figure 2:
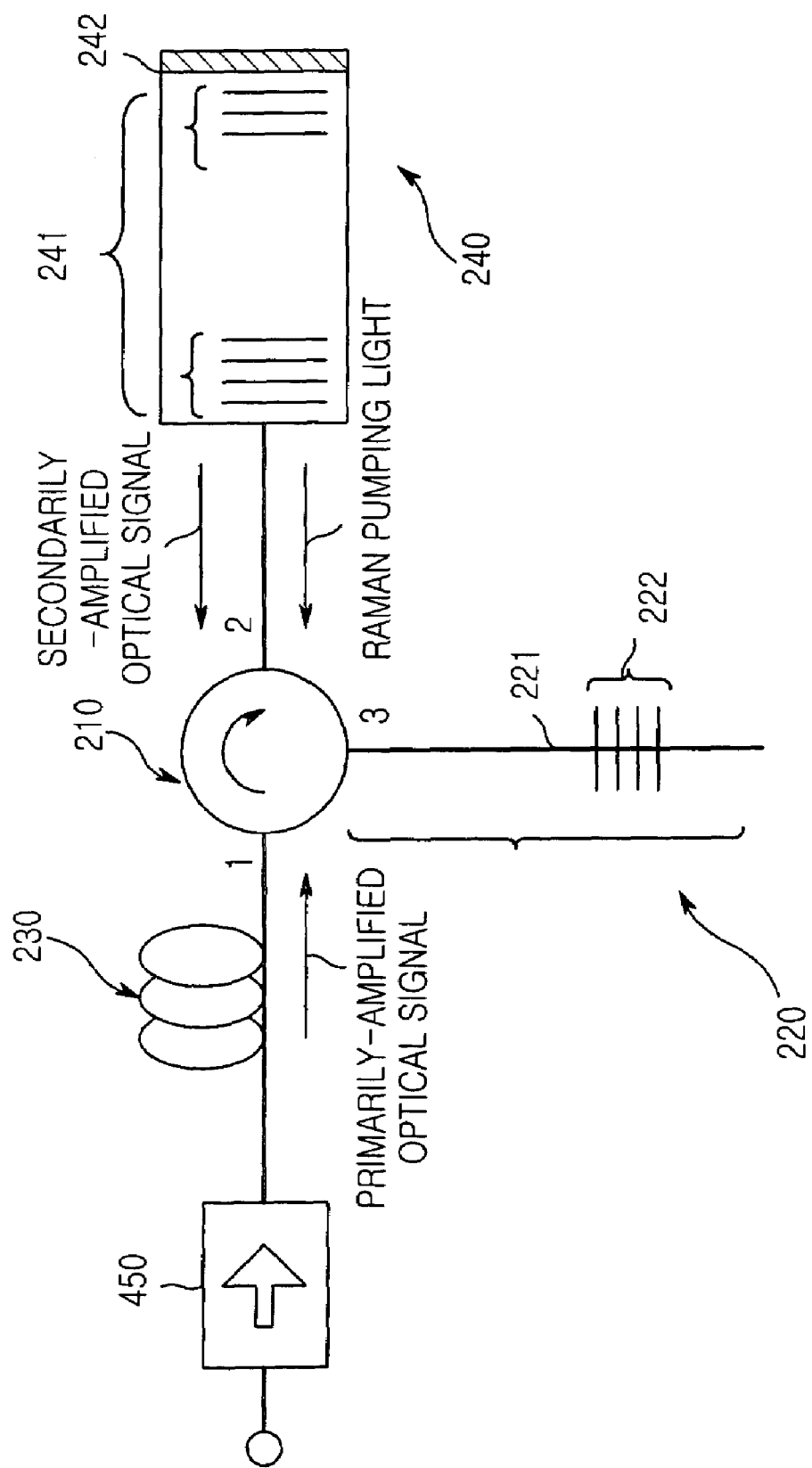
FIG. 2 is a schematic diagram illustrating the configuration of a Raman optical amplifier according to a preferred embodiment of the present invention.

FIG. 2 illustrates the configuration of a Raman optical amplifier according to a preferred embodiment of the present invention. The Raman optical amplifier includes a fiber amplifier 230 for primarily amplifying an optical signal advancing therein, and a semiconductor optical amplifier 240 for outputting a Raman pumping light of a predetermined wavelength while secondarily amplifying the optical signal amplified by the fiber amplifier 230. The Raman optical amplifier also includes a circulator 210 arranged between the semiconductor optical amplifier 240 and the fiber amplifier 230, and adapted to control inputting and outputting of the optical signal and Raman pumping light, and a fiber grating 220 connected to the circulator 210.

The fiber amplifier 230 is Raman-pumped by the Raman pumping light outputted from the semiconductor optical amplifier 240 and as a consequence primarily amplifies an inputted optical signal to create a Raman-amplified optical signal. This Raman-amplified optical signal is outputted to the circulator 210. For the fiber amplifier 230, a single-mode optical fiber, a non-zero dispersion shifted fiber, or other fibers known to artisan may be used. The non-zero dispersion shifted fiber can be used for an effective diameter of core which is smaller than the single-mode optical fiber, and can reduce pumping power than the single-mode optical fiber.

The semiconductor optical amplifier 240 has opposite ports with associated Bragg gratings 241 of a predetermined grating period, respectively, and a highly reflective layer 242 attached to one of the Bragg gratings 241. The semiconductor optical amplifier 240 outputs, to the circulator 210, the Raman pumping light of predetermined wavelength adapted to Raman-pump the fiber amplifier 230, and a secondarily-amplified optical signal obtained by re-amplifying the primarily-amplified optical signal. That is, the Bragg gratings 241 of the semiconductor optical amplifier 240 resonate light of the predetermined wavelength generated in the semiconductor optical amplifier 240 until the intensity of the light reaches a predetermined level. At that point in time, the resonating light is outputted, as a Raman pumping light, to the circulator 210. The semiconductor optical amplifier 240 also secondarily amplifies the primarily-amplified optical signal inputted thereto, and then outputs the resultant optical signal to the circulator 210.

The Bragg gratings 241 respectively arranged at opposite ports of the semiconductor optical amplifier 240 are configured to have a grating period for reflecting the Raman pumping light so that the light secondarily amplified in the semiconductor optical amplifier 240 can be outputted from the semiconductor optical amplifier 240. Also, the Bragg gratings 241 serve as resonators for resonating the Raman pumping light until the light has an intensity reaching a predetermined level. Thus, a Raman pumping light having an intensity sufficient to Raman-pump the fiber amplifier 230 can be outputted from the semiconductor optical amplifier 240. The Bragg gratings 241 at opposite ports of the semiconductor optical amplifier 240 are arranged to face each other while being spaced apart from each other by a predetermined distance, so as to output the light generated in the semiconductor optical amplifier 240, as a Raman pumping light having a predetermined intensity. Since the highly reflective layer 242 is provided at one port of the semiconductor optical amplifier 240 opposite to the circulator 210, the Raman pumping light and secondarily-amplified optical signal are outputted only to the circulator 210.

The circulator 210 has a first port connected to the fiber amplifier 230, a second port connected to the semiconductor optical amplifier 240, and a third port connected to the fiber grating 220. The circulator 210 outputs to its second port the primarily-amplified optical signal inputted to its first port, while outputting, to its third port, the secondarily-amplified optical signal and Raman pumping light inputted to its second port. The circulator 210 also outputs, to its first port, the Raman pumping light re-inputted to its third port after being reflected by the fiber grating 220.

The fiber grating 220 includes an optical fiber 221 connected to the third port of the circulator 210, and, formed on the optical fiber, a Bragg grating 222 having a predetermined grating period to reflect the Raman pumping light. The Bragg grating 222 of the fiber grating 220, out of the secondarily-amplified optical signal and Raman pumping light received from the third port, reflects the Raman pumping light to the third port and pass the secondarily-amplified optical signal, so that it reflects, to the third port of the circulator 210, the secondarily-amplified optical signal received from the third port of the circulator 210.

The isolator 250 outputs an externally inputted optical signal to the fiber amplifier 230, while preventing the primarily-amplified light, i.e., the light Raman-amplified in the fiber amplifier 230, from being externally outputted.

Figure 3:
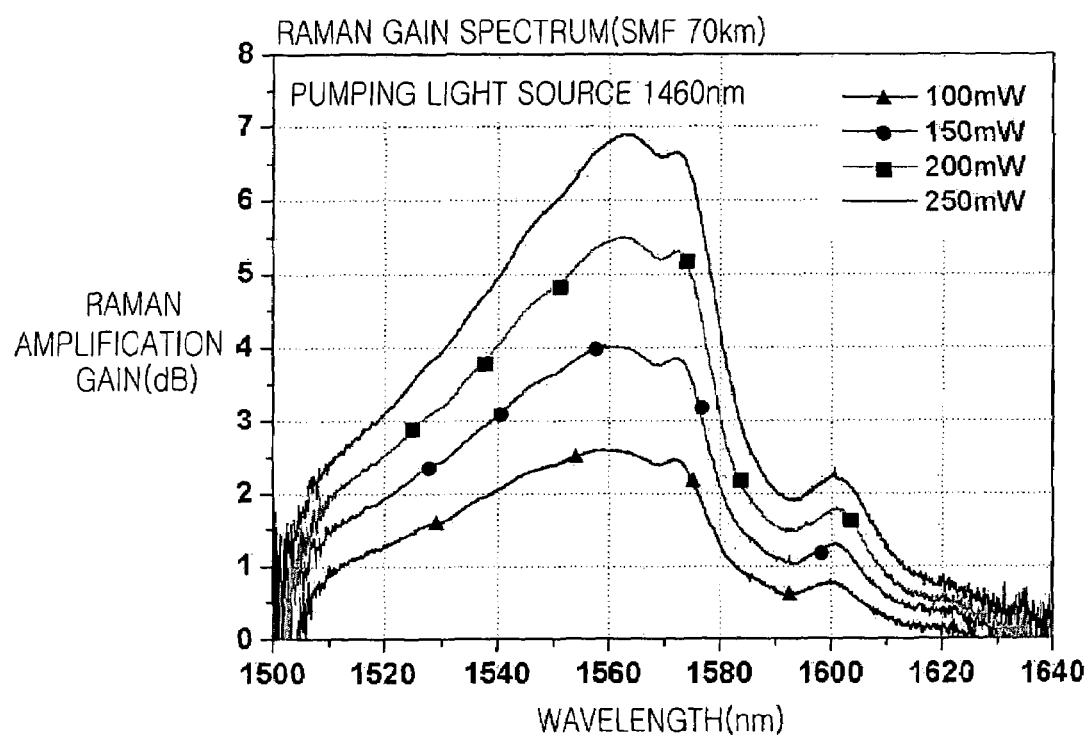
FIG. 3 is a graph depicting a Raman gain spectrum representing a variation in the intensity of an optical signal, amplified in a Raman optical amplifier having a length of 70 km by a Raman pumping light of 1,460 nm, depending on the intensity of the Raman pumping light.

FIG. 3 is a graph depicting a Raman gain spectrum representing a variation in the intensity of an amplified optical signal. The signal is amplified in the fiber amplifier 230 by the Raman pumping light outputted from the semiconductor optical amplifier 240, as shown in FIG. 2. The level of amplification depends on the intensity of the Raman pumping light where the Raman pumping light has a wavelength of 1,460 nm, and the fiber amplifier 230 has a length of 70 km. In the graph, the x-axis represents the wavelength range of the optical signal outputted from the fiber amplifier 230, and the y-axis represents the Raman amplification gain (dB) of the Raman gain spectrum. The Raman gain spectrum represents a variation in the intensity of an optical signal amplified in the fiber amplifier 230 having a wavelength of 1,560 nm in dependence upon a variation in the intensity of the Raman pumping light having a wavelength of 1,460 nm.

Where the Raman pumping light has a Raman gain of 100 mW, the Raman-amplified optical signal of 1,560 nm has a Raman gain of 2.5 dB or more. On the other hand, the Raman-amplified optical signal of 1,560 nm has a Raman gain of about 4 dB when the Raman pumping light has a Raman gain of 150 mW. Also, the Raman-amplified optical signal of 1,560 nm has a Raman gain of about 5.5 dB when the Raman pumping light has a Raman gain of 200 mW, while having a Raman gain of about 7 dB when the Raman-amplified optical signal of 1,560 nm has a Raman gain of 250 mW. For the fiber amplifier used in the Raman gain spectrum measurement of FIG. 3, a single-mode optical fiber having a length of 70 km was employed. Accordingly, the optical signal inputted to the fiber amplifier 230 and Raman-amplified by the Raman pumping light in the fiber amplifier varies in intensity in accordance with the intensity of the Raman pumping light.

The optical amplifier maintains the Raman gain and reduces the strength of the pumping light source used for the Raman optical amplifier, by using the non-zero dispersion shifted fiber in which the effective core area is small.

As described above, in the Raman optical amplifier according to the present invention, the fiber amplifier 230 Raman-amplifies an input optical signal for output as a primarily-amplified optical signal which is, in turn, secondarily amplified by the semiconductor optical amplifier 240. Advantageously, optical signal amplification efficiency is increased. In addition, it is unnecessary to use a separate Raman pumping light source, so that it is possible to minimize the power consumption and volume of the Raman optical amplifier.

As apparent from the above description, the present invention provides a Raman optical amplifier in which its semiconductor optical amplifier 240 serves as both a Raman pumping light source and an optical amplifier. Accordingly, the Raman optical amplifier of the present invention offers low manufacturing costs and reduced volume. Since an input optical signal is amplified twice, by the fiber amplifier and semiconductor optical amplifier of the Raman optical amplifier, an improvement in amplification efficiency becomes possible. Since the semiconductor optical amplifier also serves as the Raman pumping light source, there is no consumption of driving current caused by use of a separate Raman pumping light source, so that it is possible to reduce the consumption of driving current.

While this invention has been described in connection with what is presently considered to be the most practical and preferred embodiment, it is to be understood that the invention is not limited to the disclosed embodiment, but, to the contrary, it is intended to cover various modifications within the spirit and scope of the appended claims.

What is claimed is:

1. A Raman optical amplifier comprising:
    a first amplifier for Raman-amplifying an input optical signal to form a primarily-amplified optical signal;
    a second amplifier for outputting a Raman pumping light of a predetermined wavelength to Raman-pump the first amplifier, while amplifying the primarily-amplified optical signal to form a secondarily-amplified optical signal;
    a circulator having first through third ports, the circulator being configured to receive the primarily-amplified optical signal at the first port, to output the received primarily-amplified optical signal to the second port, to receive the Raman pumping light and the secondarily-amplified optical signal at the second port, to output the received Raman pumping light and secondarily-amplified optical signal to the third port, to re-receive the Raman pumping light at the third port, and to output the re-received Raman pumping light to the first port; and
    a filtering device connected to said third port, the filtering device being configured to reflect the Raman pumping light received from said third port while passing the secondarily-amplified optical signal received from said third port. wherein the filtering device comprises an optical fiber connected to the third port of the circulator, a Bragg grating being formed on the optical fiber, the Bragg grating having a predetermined grating period to reflect the Raman pumping light received from the third port of the circulator.

2. The Raman optical amplifier according to claim 1, further comprising an isolator connected to the fiber amplifier and configured to output said input optical signal to the fiber amplifier.

3. The Raman optical amplifier according to claim 1, wherein the second amplifier is a semiconductor optical amplifier having opposite ports and, disposed respectively at said opposite ports, Bragg gratings having a predetermined grating period to output a Raman pumping light having a predetermined intensity, a highly reflective layer being attached to one of the Bragg gratings to output said Raman pumping light and said secondarily-amplified optical signal to the second port of the circulator.

4. The Raman optical amplifier according to claim 1, wherein the Raman pumping light has a wavelength selected from a wavelength range lower, by about 100 nm, than a wavelength of the input optical signal to be Raman-amplified.

5. The Raman optical amplifier of claim 4, wherein the Raman pumping light wavelength is from a range lower, by between 80 and 120 nm, than said wavelength of the input optical signal.

6. The Raman optical amplifier of claim 5, wherein the Raman pumping light wavelength selected is 1460 nm.

7. The Raman optical amplifier of claim 4, wherein the selection is performed in accordance with a purpose for use of the Raman amplified signal.

8. The Raman optical amplifier of claim 1, wherein the first amplifier comprises a non-zero dispersion shifted fiber.

* * * * *